(12) United States Patent
Sakaguchi

(10) Patent No.: US 8,723,594 B2
(45) Date of Patent: May 13, 2014

(54) OVERCURRENT PROTECTION CIRCUIT

(71) Applicant: Seiko Instruments Inc., Chiba (JP)

(72) Inventor: Kaoru Sakaguchi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/785,443

(22) Filed: Mar. 5, 2013

(65) Prior Publication Data

US 2013/0249599 A1  Sep. 26, 2013

(30) Foreign Application Priority Data

Mar. 23, 2012  (JP) ................................. 2012-068024

(51) Int. Cl.
*G05F 1/10* (2006.01)
(52) U.S. Cl.
USPC .............................. 327/538; 327/541; 327/53
(58) Field of Classification Search
CPC .................................. G05F 1/465; G05F 3/262
USPC ...................................... 327/54, 540, 541, 83
See application file for complete search history.

(56) References Cited

U.S. PATENT DOCUMENTS

| | | | |
|---|---|---|---|
| 6,323,630 B1 * | 11/2001 | Banba | 323/313 |
| 7,015,826 B1 * | 3/2006 | Chan et al. | 340/870.17 |
| 7,301,321 B1 * | 11/2007 | Uang et al. | 323/313 |
| 7,432,825 B2 * | 10/2008 | Chan et al. | 340/870.17 |
| 7,581,882 B2 * | 9/2009 | Noguchi | 374/178 |
| 7,703,975 B2 * | 4/2010 | Kim | 374/170 |
| 8,283,609 B2 * | 10/2012 | Jeong | 219/512 |
| 2008/0018317 A1 * | 1/2008 | Chen et al. | 323/313 |
| 2008/0018319 A1 * | 1/2008 | Chang et al. | 323/315 |
| 2008/0042737 A1 * | 2/2008 | Kim et al. | 327/539 |
| 2008/0088361 A1 * | 4/2008 | Kimura | 327/541 |
| 2008/0259990 A1 * | 10/2008 | Takeuchi | 374/1 |
| 2009/0121699 A1 * | 5/2009 | Park et al. | 323/313 |
| 2009/0174468 A1 * | 7/2009 | Yoshida et al. | 327/539 |
| 2010/0073070 A1 * | 3/2010 | Ng et al. | 327/513 |
| 2011/0234300 A1 * | 9/2011 | Zhang et al. | 327/512 |

FOREIGN PATENT DOCUMENTS

JP  2002-280886 A  9/2002

* cited by examiner

*Primary Examiner* — Ryan Jager
(74) *Attorney, Agent, or Firm* — Brinks Gilson & Lione

(57) ABSTRACT

The semiconductor device includes: a first transistor controlled by a control signal; a sense voltage generating circuit for sensing current flowing through the first transistor, mirroring current flowing through a reference current circuit, and summing the currents to generate voltage based on the summed currents; a reference voltage circuit for mirroring current flowing through the reference current circuit and generating reference voltage; an amplifier for comparing the voltage generated by the sense voltage generating circuit and the reference voltage; and a second transistor which has a gate connected to an output terminal of the amplifier and which can turn off the first transistor.

4 Claims, 4 Drawing Sheets

OVERCURRENT PROTECTION CIRCUIT

RELATED APPLICATIONS

This application claims priority under 35 U.S.C. §119 to Japanese Patent Application No. 2012-068024 filed on Mar. 23, 2012, the entire content of which is hereby incorporated by reference.

BACKGROUND OF THE INVENTION

1. Field of the Invention

The present invention relates to a semiconductor device having an overheat and overcurrent protective function.

2. Description of the Related Art

A conventional semiconductor device is described with reference to FIG. 4 which is a circuit diagram illustrating the conventional semiconductor device.

The conventional semiconductor device includes an overcurrent detection unit 304, a thermal shut down detection unit (hereinafter referred to as TSD detection unit) 309, NMOS transistors 301, 302, 306, and 307, resistors 303, 305, and 308, a ground terminal 100, and external terminals 321 and 322. The overcurrent detection unit 304, the resistor 303, and the NMOS transistor 306 form an overcurrent protective circuit 331. The NMOS transistor 307 and the TSD detection unit 309 form an overheat protective circuit 332.

The NMOS transistor 301 is controlled to be turned on/off in response to a signal from the external terminal 322. The overcurrent protective circuit 331 protects the NMOS transistor 301 from overcurrent. Similarly, the overheat protective circuit 332 protects the NMOS transistor 301 from overheat. The overcurrent protective circuit 331 includes the overcurrent detection unit 304. The overcurrent detection unit 304 detects a drain current ID of the NMOS transistor 301 by, for example, referring to current which flows through the NMOS transistor 302. When the current ID reaches an overcurrent limit value, the overcurrent detection unit 304 turns on the NMOS transistor 306 and forcibly grounds the external terminal 322 to turn off the NMOS transistor 301. In this way, the NMOS transistor 301 is protected from breakage due to overcurrent. The overheat protective circuit 332 includes the TSD detection unit 309. When the temperature of the semiconductor device reaches an initially set temperature, the TSD detection unit 309 turns on the NMOS transistor 307 and forcibly grounds the external terminal 322. In this way, the NMOS transistor 301 is protected from breakage due to overheat.

The overcurrent detection unit 304 of the overcurrent protective circuit 331 detects the drain current ID of the NMOS transistor 301. When the current ID reaches an overcurrent detection value, the overcurrent protective circuit 331 exerts control so that the response time of the overheat protective circuit 332 is reduced to inhibit the energy applied to the NMOS transistor 301. In this way, in an area in which the apparent allowable power is high, the range of a safe operating area is extended, and protection from overcurrent and overheat can be provided in the wide safe operating area (see, for example, Japanese Patent Application Laid-open No. 2002-280886).

However, in the conventional technology, the safe operating area of a semiconductor device does not conform to the actual characteristics of the allowable power dissipation of the semiconductor device, and, even within the safe operating area, there is an area in which the protective circuits operate and thus the semiconductor device cannot be used.

SUMMARY OF THE INVENTION

The present invention has been made in view of the above-mentioned problem, and enables setting of arbitrary overcurrent protection characteristics in accordance with the allowable power dissipation characteristics of a semiconductor device.

In order to solve the problem of the conventional technology, a semiconductor device according to an exemplary embodiment of the present invention has the following configuration.

The semiconductor device includes a first transistor controlled by a control signal; a reference current circuit; a sense voltage generating circuit for sensing current flowing through the first transistor, mirroring current flowing through the reference current circuit, and summing the currents to generate voltage based on the summed currents; a reference voltage circuit for mirroring current flowing through the reference current circuit and generating voltage; an amplifier for comparing the voltage generated by the sense voltage generating circuit and the voltage generated by the reference voltage circuit; and a second transistor which has a gate connected to an output terminal of the amplifier and which can turn off the first transistor.

The semiconductor device having an overheat and overcurrent protective function according to the present invention can set arbitrary overcurrent protection characteristics in accordance with the allowable power dissipation characteristics of the semiconductor device, and thus, a safe semiconductor device can be provided without reducing the efficiency.

DETAILED DESCRIPTION OF THE PREFERRED EMBODIMENTS

Embodiments of the present invention are described in the following with reference to the attached drawings.

First Embodiment

Figure 1:
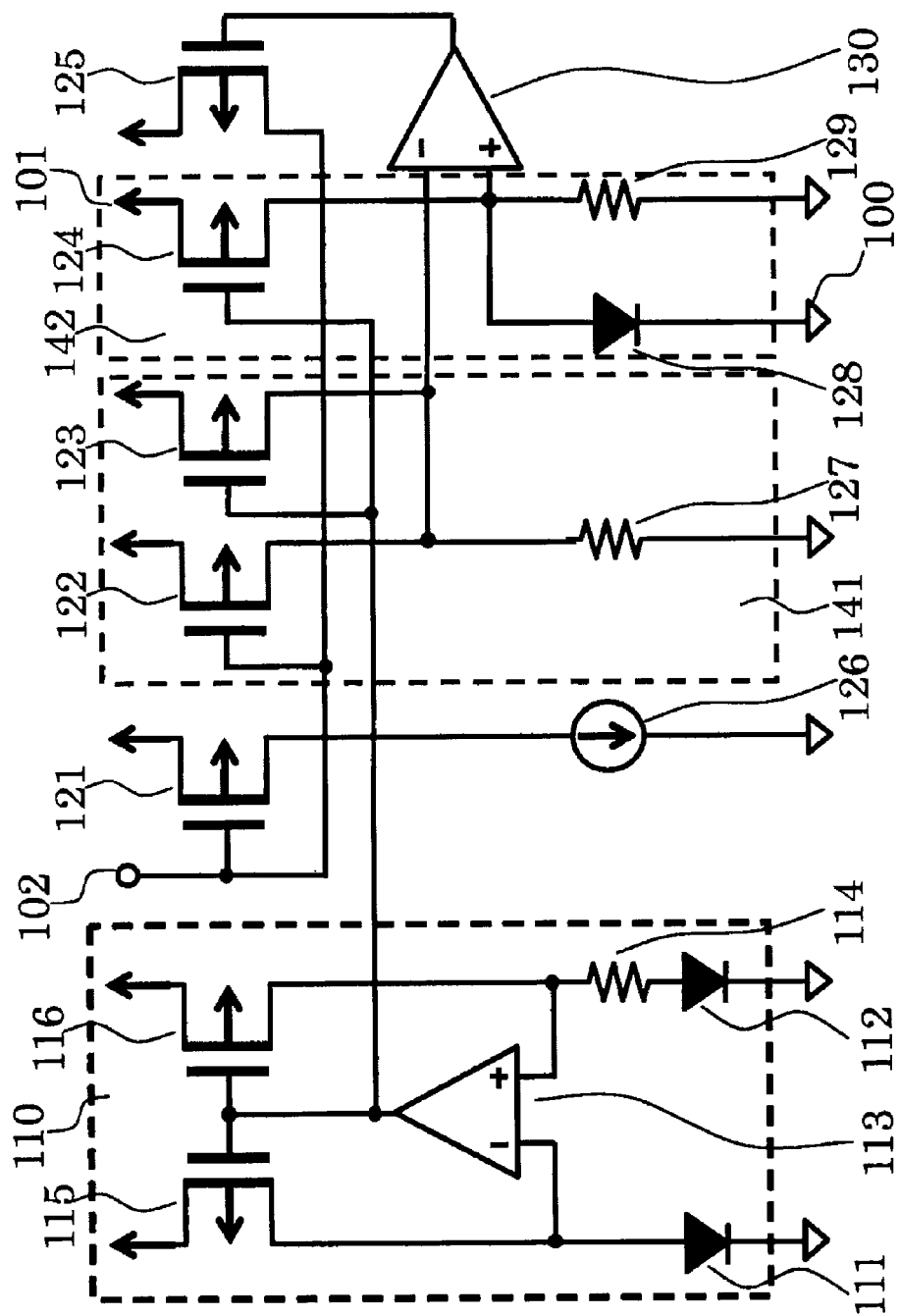
FIG. 1 is a circuit diagram illustrating a semiconductor device according to a first embodiment of the present invention.

FIG. 1 is a circuit diagram of a semiconductor device according to a first embodiment of the present invention.

The semiconductor device of the first embodiment includes amplifiers 113 and 130, PMOS transistors 115, 116, 121, 122, 123, 124, and 125, a load current source 126, PN junction elements 111, 112, and 128, resistors 114, 127, and 129, a power supply terminal 101, a control terminal 102, and a ground terminal 100. The PMOS transistors 115 and 116, the amplifier 113, the PN junction elements 111 and 112, and the resistor 114 form a reference current circuit 110. The PMOS transistors 122 and 123 and the resistor 127 form a sense voltage generating circuit 141. The PMOS transistor 124, the PN junction element 128, and the resistor 129 form a reference voltage circuit 142.

Next, connection in the semiconductor device of the first embodiment is described. An inverting input terminal of the amplifier 113 is connected to a node between a drain of the PMOS transistor 115 and an anode of the PN junction element 111, and a non-inverting input terminal of the amplifier 113 is connected to a node between a drain of the PMOS transistor 116 and one terminal of the resistor 114. An output terminal of the amplifier 113 is connected to a gate of the PMOS transistor 115, a gate of the PMOS transistor 116, a gate of the PMOS transistor 123, and a gate of the PMOS transistor 124. An anode of the PN junction element 112 is connected to the other terminal of the resistor 114, and a cathode thereof is connected to the ground terminal 100. A cathode of the PN junction element 111 is connected to the ground terminal 100. A source of the PMOS transistor 115 is connected to the power supply terminal 101, and a source of the PMOS transistor 116 is connected to the power supply terminal 101. A gate of the PMOS transistor 121 is connected to the control terminal 102, a gate of the PMOS transistor 122, and a drain of the PMOS transistor 125. A drain of the PMOS transistor 121 is connected to one terminal of the load current source 126, and a source thereof is connected to the power supply terminal 101. The other terminal of the load current source 126 is connected to the ground terminal 100. A drain of the PMOS transistor 122 is connected to one terminal of the resistor 127, a drain of the PMOS transistor 123, and an inverting input terminal of the amplifier 130. A source of the PMOS transistor 122 is connected to the power supply terminal 101. The other terminal of the resistor 127 is connected to the ground terminal 100. A source of the PMOS transistor 123 is connected to the power supply terminal 101. A drain of the PMOS transistor 124 is connected to a non-inverting input terminal of the amplifier 130, one terminal of the resistor 129, and an anode of the PN junction element 128. A source of the PMOS transistor 124 is connected to the power supply terminal 101. The other terminal of the resistor 129 is connected to the ground terminal 100. A cathode of the PN junction element 128 is connected to the ground terminal 100. An output terminal of the amplifier 130 is connected to a gate of the PMOS transistor 125. A source of the PMOS transistor 125 is connected to the power supply terminal 101.

Next, operation of the semiconductor device of the first embodiment is described.

When a Lo signal is input from the control terminal 102, the PMOS transistor 121 passes current to drive the load current source 126. For example, when the semiconductor device is a voltage regulator, the control terminal 102 is connected to an output terminal of a differential amplifier, and the load current source 126 is a load circuit which is driven by the voltage of the differential amplifier.

The size of the PMOS transistor 122 is smaller than the size of the PMOS transistor 121, and the gate of the PMOS transistor 122 is connected to the control terminal 102. Therefore, the PMOS transistor 122 passes sense current in accordance with the current which flows through the PMOS transistor 121. The PMOS transistor 123 mirrors the current which flows through the reference current circuit 110 and passes offset current. The sense current and the offset current flow through the resistor 127 and the resistor generates voltage in accordance with the currents. The PMOS transistor 124 mirrors the current which flows through the reference current circuit 110 and passes constant current. The constant current flows through the resistor 129 and the PN junction element 128 which are connected in parallel to generate reference voltage.

When high current flows through the PMOS transistor 121 due to, for example, short circuit of the load current source 126 to the ground terminal 100, the sense current of the PMOS transistor 122 also increases to raise the voltage generated at the resistor 127. When this voltage becomes higher than the reference voltage, the amplifier 130 outputs a Lo signal to turn on the PMOS transistor 125, and forcibly short-circuits the gate of the PMOS transistor 121 to the power supply terminal 101 to turn off the PMOS transistor 121. In this way, overcurrent protection can be provided.

Figure 3:
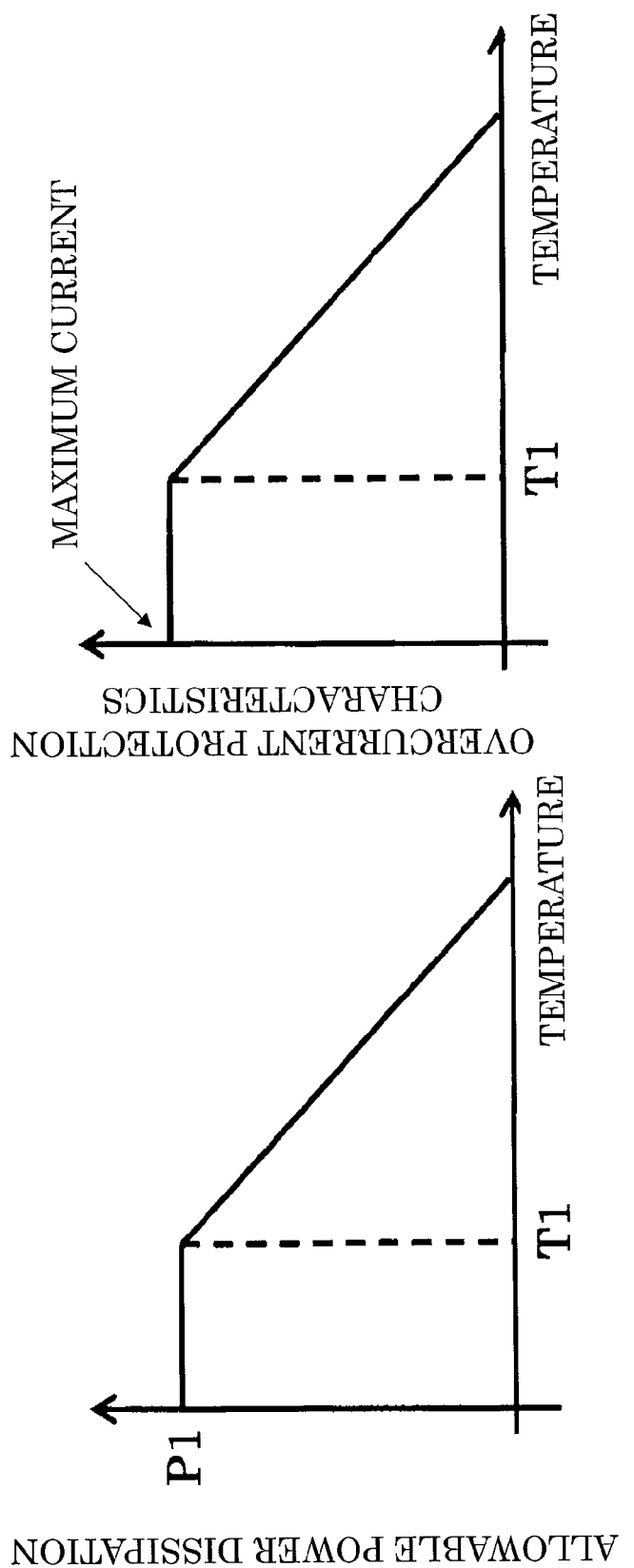
FIG. 3 is an explanatory diagram of operation according to the first and second embodiments.
Figure 4:
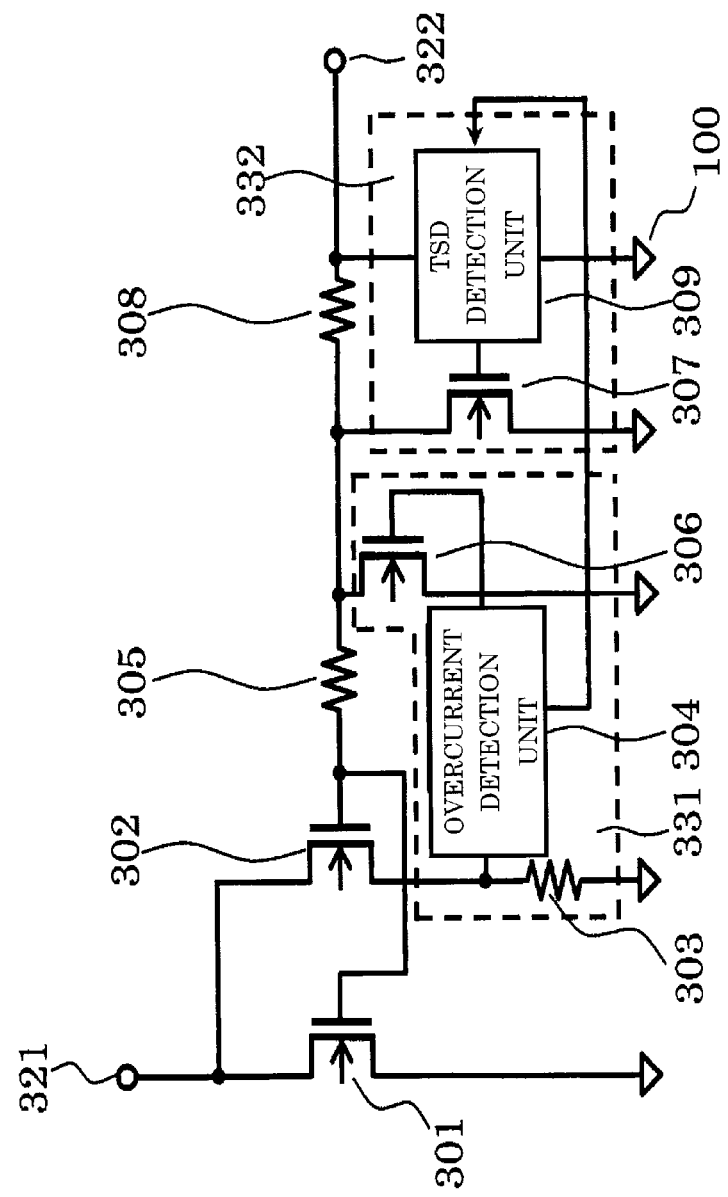
FIG. 4 is a circuit diagram illustrating a conventional semiconductor device.

Without the PN junction element 128, the reference voltage is flat with respect to temperature. In the reference voltage circuit 142, by connecting in parallel the PN junction element 128 and the resistor 129 and adjusting the resistance value of the resistor 129, the reference voltage may have a negative slope with respect to temperature when the temperature is equal to or higher than an arbitrary temperature. When the reference voltage has a negative slope with respect to temperature, as the temperature rises, the reference voltage is lowered, and thus, the current value for the overcurrent protection can be lowered. Therefore, as shown in FIG. 3, in accordance with the allowable power dissipation characteristics of the semiconductor device, adjustment can be made so that the current value for the overcurrent protection is lowered when the temperature rises and exceeds a temperature T1.

Further, by adjusting the magnitude of the offset current through adjustment of the size of the PMOS transistor 123, the voltage across the resistor 127 can be set to have an arbitrary offset voltage, and thus, the current value in a temperature area in which the current value for the overcurrent protection is flat with respect to temperature can be arbitrarily controlled.

Note that, by further adjusting the resistance values of the resistor 127 and the resistor 129 and the sizes of the PMOS transistors 122, 123, and 124, the current value for the overcurrent protection as the temperature rises can be adjusted as well. Further, as the PN junction elements, a saturated connected diode or bipolar transistor, or a MOS transistor operating in weak inversion can be used, and the present invention is not limited to any specific embodiment.

As described above, the semiconductor device of the first embodiment can set overcurrent protection characteristics in accordance with the allowable power dissipation characteristics of the semiconductor device. Therefore, a safe semiconductor device can be provided without reducing the efficiency.

Second Embodiment

Figure 2:
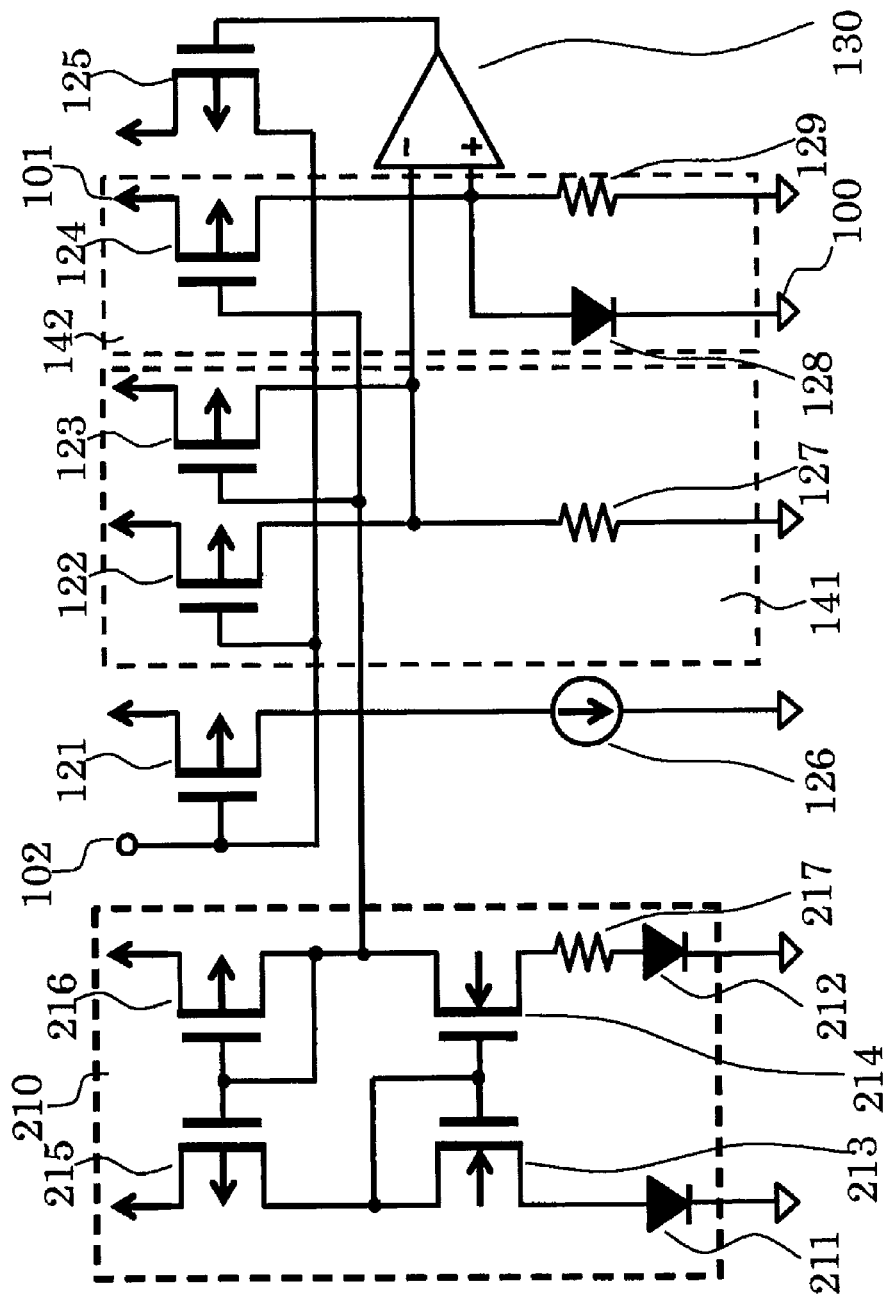
FIG. 2 is a circuit diagram illustrating a semiconductor device according to a second embodiment of the present invention.

FIG. 2 is a circuit diagram of a semiconductor device according to a second embodiment of the present invention. The circuit is different from the circuit illustrated in FIG. 1 in the structure of the reference current circuit 110. In the semiconductor device of the second embodiment, PMOS transistors 215 and 216, NMOS transistors 213 and 214, PN junction elements 211 and 212, and a resistor 217 form a reference current circuit 210. Except for this point, the second embodiment is the same as the first embodiment.

Connection in the semiconductor device of the second embodiment is now described. A gate of the PMOS transistor 215 is connected to a gate and a drain of the PMOS transistor 216, a drain of the PMOS transistor 215 is connected to a gate and a drain of the NMOS transistor 213 and to a gate of the NMOS transistor 214, and a source of the PMOS transistor 215 is connected to the power supply terminal 101. A source of the PMOS transistor 216 is connected to the power supply terminal 101. An anode of the PN junction element 211 is connected to a source of the NMOS transistor 213, and a cathode thereof is connected to the ground terminal 100. A drain of the NMOS transistor 214 is connected to the drain of the PMOS transistor 216, the gate of the PMOS transistor 123, and the gate of the PMOS transistor 124, and a source of the NMOS transistor 214 is connected to one terminal of the resistor 217. An anode of the PN junction element 212 is connected to the other terminal of the resistor 217, and a cathode thereof is connected to the ground terminal 100. Other connections are the same as those in the first embodiment.

Next, operation of the semiconductor device of the second embodiment is described. Operation of the PMOS transistor 121 is controlled by a signal from the control terminal 102, and the load current source 126 is driven with the current from the PMOS transistor 121. The size of the PMOS transistor 122 is smaller than the size of the PMOS transistor 121, and the gate of the PMOS transistor 122 is connected to the control terminal 102, and thus, the PMOS transistor 122 senses current which behaves in the same way as the current which flows through the PMOS transistor 121 and can pass sense current. The PMOS transistor 123 mirrors the current from the reference current circuit 210 and passes offset current. The sense current and the offset current flow through the resistor 127 and voltage is generated. The PMOS transistor 124 mirrors the current from the reference current circuit 210 and passes constant current. The constant current flows through the resistor 129 and the PN junction element 128 to generate reference voltage.

When high current flows through the PMOS transistor 121 due to, for example, short circuit of the load current source 126 to the ground terminal 100, the sense current of the PMOS transistor 122 also increases to raise the voltage generated at the resistor 127. When this voltage becomes higher than the reference voltage, the amplifier 130 outputs a Lo signal to turn on the PMOS transistor 125, and forcibly short-circuits the gate of the PMOS transistor 121 to the power supply terminal 101 to turn off the PMOS transistor 121. In this way, overcurrent protection can be provided. Without the PN junction element 128, the reference voltage is flat with respect to temperature. By connecting in parallel the PN junction element 128 and the resistor 129 and adjusting the resistance value of the resistor 129, the reference voltage may have a negative slope with respect to temperature when the temperature is equal to or higher than an arbitrary temperature. When the reference voltage has a negative slope with respect to temperature, as the temperature rises, the reference voltage is lowered, and thus, the current value for the overcurrent protection can be lowered. In this way, as shown in FIG. 3, in accordance with the allowable power dissipation characteristics of the semiconductor device, the current value can be lowered when the temperature rises and exceeds the temperature T1.

Further, by adjusting the magnitude of the offset current through adjustment of the size of the PMOS transistor 123, the voltage across the resistor 127 can be set to have an arbitrary offset voltage, and thus, the current value in a temperature area in which the current value for the overcurrent protection is flat with respect to temperature can be arbitrarily controlled.

Note that, by further adjusting the resistance values of the resistor 127 and the resistor 129 and the sizes of the PMOS transistors 122, 123, and 124, the current value for the overcurrent protection as the temperature rises can be adjusted as well. Further, as the PN junction elements, a saturated connected diode or bipolar transistor, or a MOS transistor operating in weak inversion can be used, and the present invention is not limited to any specific embodiment.

As described above, the semiconductor device of the second embodiment can lower the current value for the overcurrent protection as the temperature rises in accordance with the allowable power dissipation characteristics of the semiconductor device, and can arbitrarily set a safe operating area.

What is claimed is:

1. A semiconductor device, comprising:
   a first transistor controlled by a control signal;
   a reference current circuit for generating reference current;
   a sense voltage generating circuit for generating sense voltage based on current which is a sum of current in accordance with current flowing through the first transistor and the reference current;
   a reference voltage circuit for generating reference voltage based on the reference current;
   an amplifier for comparing the sense voltage and the reference voltage; and
   a second transistor which has a gate connected to an output terminal of the amplifier and which turns off the first transistor when the sense voltage becomes higher than the reference voltage.

2. A semiconductor device according to claim 1, wherein the sense voltage generating circuit comprises:
   a third transistor for sensing the current flowing through the first transistor;
   a fourth transistor for mirroring the reference current; and
   a first resistor through which current that flows through the third transistor and current that flows through the fourth transistor flow.

3. A semiconductor device according to claim 1, wherein the reference voltage circuit comprises:
   a fifth transistor for mirroring the reference current; and
   a first PN junction element and a second resistor through which current that flows through the fifth transistor flows and which are connected in parallel with each other.

4. A semiconductor device according to claim 1, wherein the reference current circuit comprises a plurality of PN junction elements and generates current based on a forward voltage difference among the plurality of PN junction elements.

* * * * *